United States Patent
Suga

[19]

[11] Patent Number: 6,034,854
[45] Date of Patent: Mar. 7, 2000

[54] SEMICONDUCTOR INTEGRATED CIRCUIT HAVING INPUT PROTECTION CIRCUIT

[75] Inventor: Koichiro Suga, Kanagawa, Japan

[73] Assignee: NEC Corporation, Tokyo, Japan

[21] Appl. No.: 09/030,341

[22] Filed: Feb. 25, 1998

[30] Foreign Application Priority Data

Feb. 25, 1997 [JP] Japan .................................. 9-040703

[51] Int. Cl.$^7$ ...................................................... H02H 9/00
[52] U.S. Cl. ................................................................ 361/56
[58] Field of Search ............................... 361/56, 111, 119

[56] References Cited

U.S. PATENT DOCUMENTS 5,841,619   11/1998   Shigehara et al. ....................... 361/111

Primary Examiner—Ronald W. Leja

[57] ABSTRACT

In an input protection circuit for use in a semiconductor integrated circuit, a switch device 4, which becomes a conducting condition in response to an overvoltage applied between opposite ends thereof, is connected between a wiring conductor connecting an external input terminal 7 to an input node of an input first stage inverter 5 and an output node N3 of a logic gate 10 included within an internal circuit 3 provided in the semiconductor integrated circuit. When an overvoltage is applied to the external input terminal 7, the switch device 4 becomes the conducting condition so that the electric charge of the overvoltage applied to the external input terminal 7, is discharged through a MOS transistor QP6 or QN7 constituting the logic gate 10 within the internal circuit 3, to a power supply voltage line 1A or a ground potential line 2A which is laid within the internal circuit 3 for supplying a power supply voltage or a ground potential to the MOS transistor QP6 or QN7. Thus, an effective input protection circuit can be realized with a reduced occupying area on the semiconductor chip, with a reduced increase of the input terminal capacitance and with a reduced restriction to the circuit layout.

25 Claims, 6 Drawing Sheets

SEMICONDUCTOR INTEGRATED CIRCUIT HAVING INPUT PROTECTION CIRCUIT

BACKGROUND OF THE INVENTION

1. Field of the Invention

The present invention relates to a semiconductor integrated circuit, and more specifically to a semiconductor integrated circuit having an input protection circuit for discharging a surge voltage such as an overvoltage caused by for example a static electricity applied to an external terminal, to a power supply voltage node or a ground potential node.

2. Description of Related Art

Examples of the prior art input protection circuit used for an input protection of a semiconductor integrated circuit (LSI), will be described with FIGS. 1, 2, 3A and 3B. FIG. 1 is a circuit diagram illustrating one example of the prior art input protection circuit, which will be called a first prior art example. As shown in FIG. 1, this input protection circuit includes a p-channel MOS field effect transistor (called a "pMOS transistor" hereinafter) QP3 as a protecting element for discharging a current to a power supply voltage side. This pMOS transistor QP3 is connected in the form of a diode in which a gate and a source are connected to each other. The source and the gate of the pMOS transistor QP3 are connected in common to a power supply voltage line 1, and a drain of the pMOS transistor QP3 is connected to an external input terminal 7. The input protection circuit also includes an n-channel MOS field effect transistor (called an "nMOS transistor" hereinafter) QN4 as a protecting element for discharging a current to a ground potential side. This nMOS transistor QN4 is also connected in the form of a diode in which a gate and a source are connected to each other. The source and the gate of the nMOS transistor QN4 are connected in common to a ground line 2, and a drain of the nMOS transistor QN4 is connected to the external input terminal 7.

In the shown example of the LSI, an input first stage circuit 5 is constituted of a CMOS inverter formed of a pMOS transistor QP1 and an nMOS transistor QN2. An input node of this inverter (namely, common-connected gates of QP1 and QN2) is connected through a resistor R5 to a connection node N1 between the above mentioned two protecting elements QP3 and QN4. An output signal of the input first stage inverter 5 is supplied an internal circuit 3 where the signal is processed. This internal circuit 3 executes a signal processing which is an object of the LSI. Incidentally, this LSI is manufactured by a so-called silicon gate process, and therefore, gate electrodes of not only the MOS transistors QP1, QN2, QP3, QN4 but also MOS transistors constituting logic gates included in the internal circuit, are formed of polysilicon. In addition, the resistor R5 is also formed of polysilicon, and is formed at the same time as formation of the gate electrodes of the MOS transistors.

FIG. 2 is a circuit diagram illustrating another example of the prior art input protection circuit, which will be called a second prior art example. As shown in FIG. 2, this input protection circuit is different from the first prior art example in that an nMOS transistor QN5 is used as a power supply voltage side protecting element. This protecting transistor QN5 has a source connected to the power supply voltage line 1, a drain connected to the input terminal 7 and a gate connected to the ground line 2. On the other hand, as the ground potential side protecting element, the nMOS transistor QN4 is provided similarly to the first prior art example. This nMOS transistor QN4 is connected in the form of a diode in which a gate and a source are connected to each other. The source and the gate of the nMOS transistor QN4 are connected in common to the ground line 2, and a drain of the nMOS transistor QN4 is connected to the external input terminal 7.

In this shown example of the LSI, an input first stage circuit 5 is constituted of a CMOS inverter formed of a pMOS transistor QP1 and an nMOS transistor QN2. An input node of this inverter is connected through a resistor R5 to a connection node N1 between the above mentioned two protecting elements QN5 and QN4.

In the input protection circuits of the above mentioned first and second prior art examples, when a surge voltage caused by for example a static electricity is applied to the input terminal 7, the polysilicon resistor R5 dulls or damps the waveform of the surge voltage. With this damping action, an abrupt surge voltage is prevented from being directly applied to the gates of the pMOS transistor QP1 and the nMOS transistor QN2 which constitute the input first stage inverter 5. On the other hand, the pMOS transistor QP3 or the nMOS transistor QN5 causes a breakdown or punch-through so as to create a current path leading to the power supply voltage line 1, so that the current is discharged to the power supply voltage line 1. Alternatively, the nMOS transistor QN4 causes a breakdown or punch-through so as to create a current path leading to the ground line 2, so that the current is discharged to the ground line 2.

In the input protection circuits of the first and second prior art examples, thus, the gate oxide film of the MOS transistors in the input first stage inverter 5 is prevented from being destroyed by action of the above mentioned two actions (namely, the damping of the surge voltage waveform and the creation of the surge current discharging path).

Now, referring to FIG. 3A, there is shown a layout pattern diagram illustrating a third example of the prior art input protection circuit, which will be called a third prior art example. This third prior art example is an input protection circuit using a common discharging line. As shown in FIG. 3A, this input protection circuit for the LSI is so configured that when a surge voltage is applied to an input terminal 7, a current path is created to extend from the input terminal 7 through an input protection circuit 21 to a scribing line 24.

This scribing line 24 is a line partitioning chips on a wafer, and when the wafer is divided into chips, a cutting line is formed by a dicer along the scribing line and the wafer is divided along the cutting line. Ordinarily, the scribing line is covered with aluminum film and is conducting with a silicon substrate. The prior art input protection circuit 21 is constituted of a lateral NPN bipolar transistor formed of two n+ diffused layers 26 and 27 and a p-type silicon substrate 29 and a PN junction diode formed of the n$^+$ diffused layer 26, the p-type silicon substrate 29 and a p+ diffused layer 25. Now, assuming that a surge voltage is applied to the input terminal 7, the current path from the input terminal 7 to the scribing line 24 is created by the lateral bipolar transistor and the forward direction diode of the input protection circuit 21.

Referring to FIG. 3B, there is shown a layout diagram illustrating how the third prior art input protection circuit is located on a semiconductor chip. As shown in FIG. 3B, the protection circuits 21 are located to the scribing line 24 constituting the common discharging line, nearer than the terminals 7 to the scribing line 24. This is for the purpose of making the resistance of the discharging path created through the input protection circuit 21 as small as possible, so as to easily discharge the current.

However, in the above mentioned prior examples, a first problem is encountered in which, when the surge voltage is applied to the input terminal, in order to discharge the current from the input terminal, there are required two discharging paths, namely, the path for discharging the current to the power supply voltage line 1 and the path for discharging the current to the ground line. Therefore, there are required at least two elements for causing the breakdown or punch-through, such as the MOS transistors QP3, QN4 and QN5 in FIGS. 1 and 2. As a result, the input protection circuit inevitably becomes large, and therefore, a necessary chip area increases.

Furthermore, a second problem is encountered in which with the increase of the area of the input protection circuit, a diffused layer capacitance and a gate capacitance of the input protecting elements become large, so that the input terminal capacitance correspondingly becomes large.

A third problem is encountered in which, in order to make the resistance of the discharging path created in the input protection circuit as small as possible so as to easily discharge the current, such a restriction that the protection circuits must be located near to the power supply voltage line or the ground line, is added to a circuit layout.

SUMMARY OF THE INVENTION

Accordingly, it is an object of the present invention to provide an input protection circuit for a semiconductor integrated circuit, which has overcome the above mentioned defects of the conventional ones.

Another object of the present invention is to provide an input protection circuit for a semiconductor integrated circuit, capable of reducing the area required for the input protection.

Still another object of the present invention is to provide an input protection circuit for a semiconductor integrated circuit, capable of having an elevated input protection without increasing the input terminal capacitance.

A further object of the present invention is to provide an input protection circuit for a semiconductor integrated circuit, capable of giving an elevated degree of freedom in the circuit layout.

The above and other objects of the present invention are achieved in accordance with the present invention by a semiconductor integrated circuit including an external terminal, an input first stage circuit connected to receive a signal supplied through the external terminal, an internal circuit receiving an output signal outputted from the input first stage circuit, for executing an inherent signal processing of the semiconductor integrated circuit for the received output signal, and an input protection circuit connected to the external terminal, for discharging an electric charge applied to the external terminal to a power supply voltage line or a ground potential line when an overvoltage sufficient to break the input first stage circuit is applied to the external terminal, the input protection circuit being configured to discharge the electric charge applied to the external terminal, to a power supply voltage line or a ground potential line which is laid within the internal circuit for supplying a power supply voltage or a ground potential into the internal circuit.

In the above mentioned semiconductor integrated circuit in accordance with the present invention, the input protection circuit is provided with only one switch device for short-circuiting between the external terminal and an output node of a logic gate included within the internal circuit, by action of a breakdown or a punch-through of the switch device caused by a surge voltage applied to the external terminal. Depending upon which of a positive voltage and a negative voltage is the surge voltage applied to the external terminal, the electric charge of the surge voltage applied to the external terminal, is discharged through a pMOS transistor or an nMOS transistor constituting the above mentioned logic gate included within the internal circuit, to a power supply voltage line or a ground potential line laid within the internal circuit, as a discharge destination. Namely, the electric charge of the surge voltage is spontaneously guided to either the power supply voltage line or the ground potential line. Accordingly, it is sufficient that the circuit element required for protecting the input first stage circuit is only the above mentioned switch device.

In addition, as the discharge destination line, the power supply voltage line or the ground potential line laid from the beginning within the internal circuit is used. In the internal circuit, it is a matter of course that the power supply voltage line and the ground potential line are located near to the MOS transistors constituting the logic gate. In an extreme case, therefore, it is no longer necessary to pay attention to the layout of the input protection circuit.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the input protection circuit in accordance with the present invention will be described with reference to the accompanying drawings.

Figure 1:
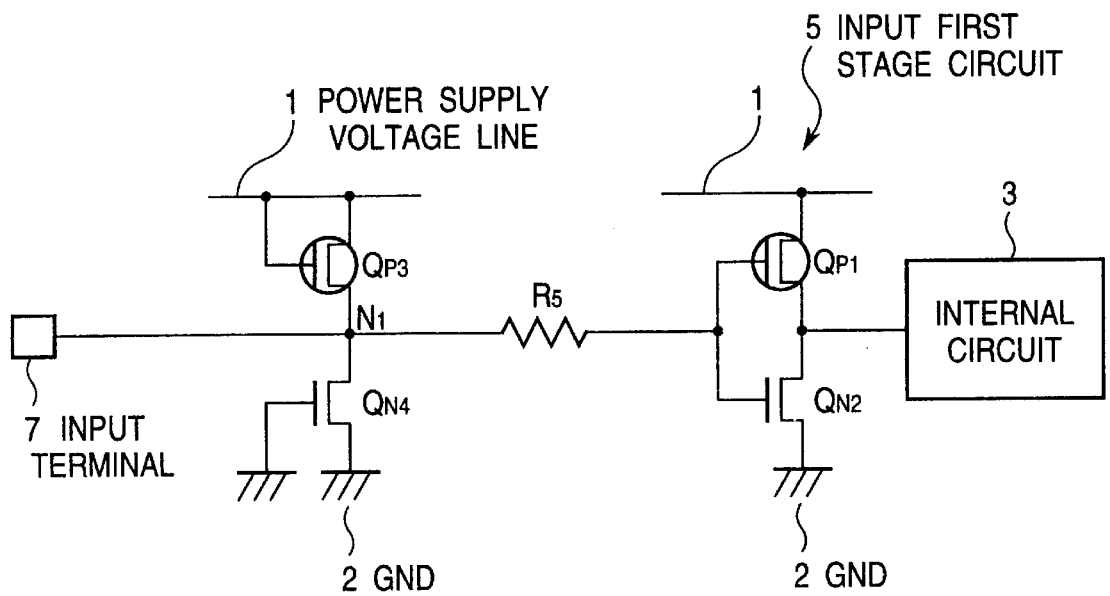
FIG. 1 is a circuit diagram illustrating the first prior art example of the input protection circuit.
Figure 2:
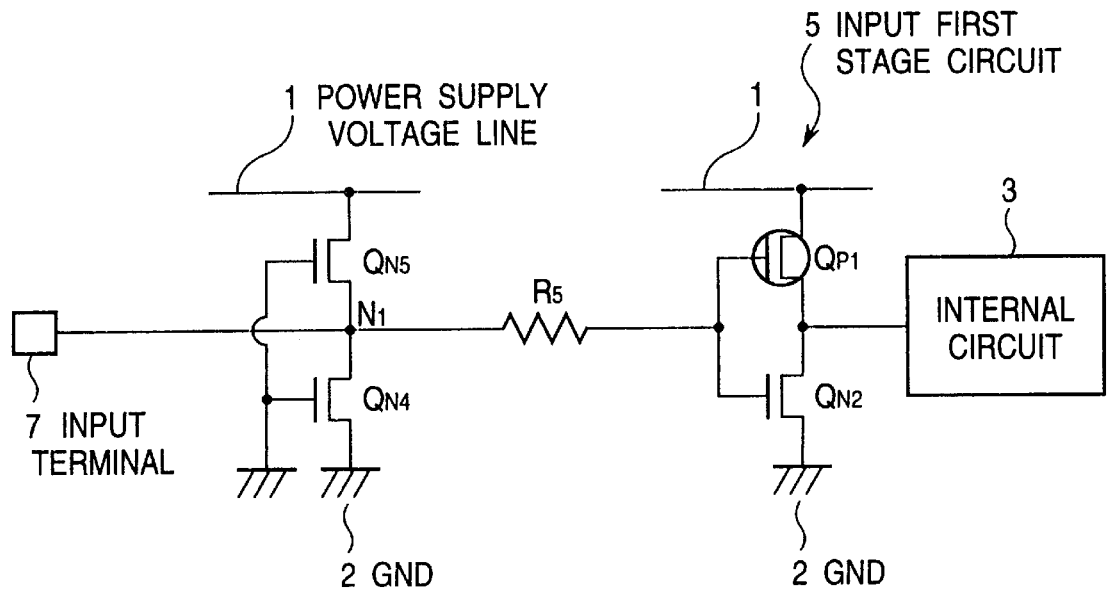
FIG. 2 is a circuit diagram illustrating the second prior art example of the input protection circuit.
Figure 3A:
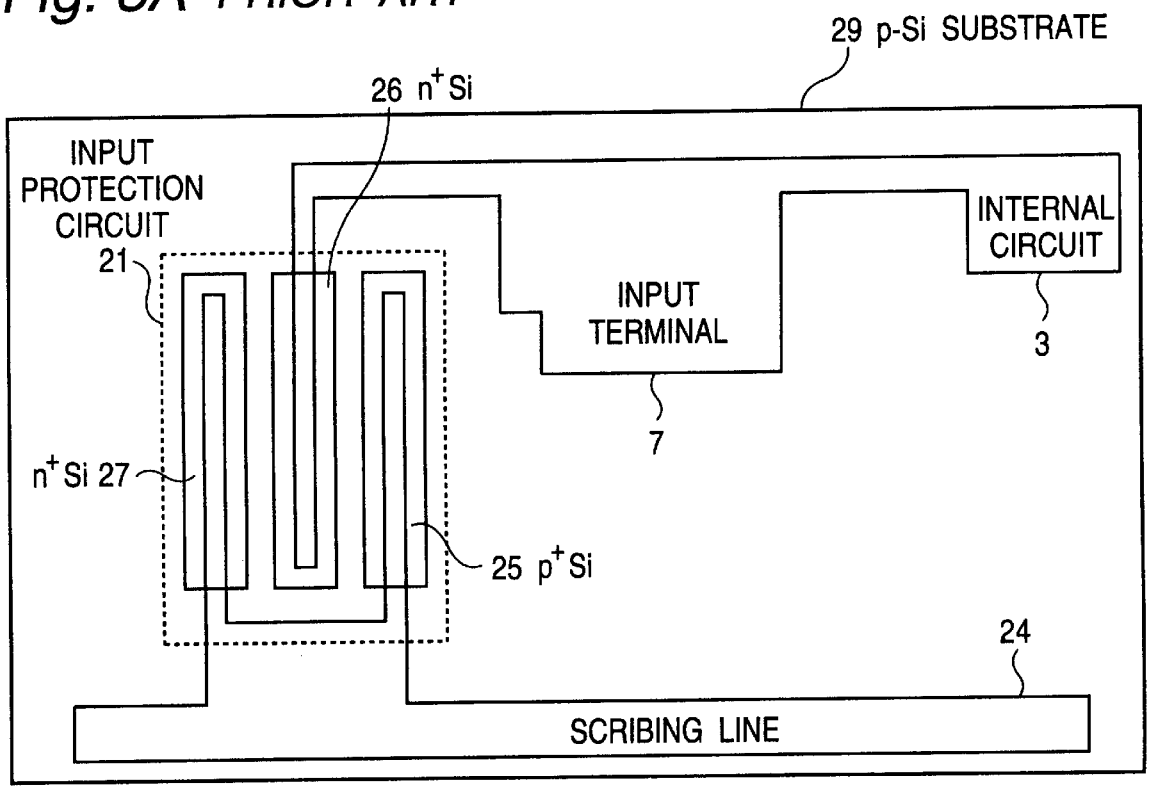
FIG. 3A is a layout pattern diagram illustrating the third prior art example of the input protection circuit.
Figure 3B:
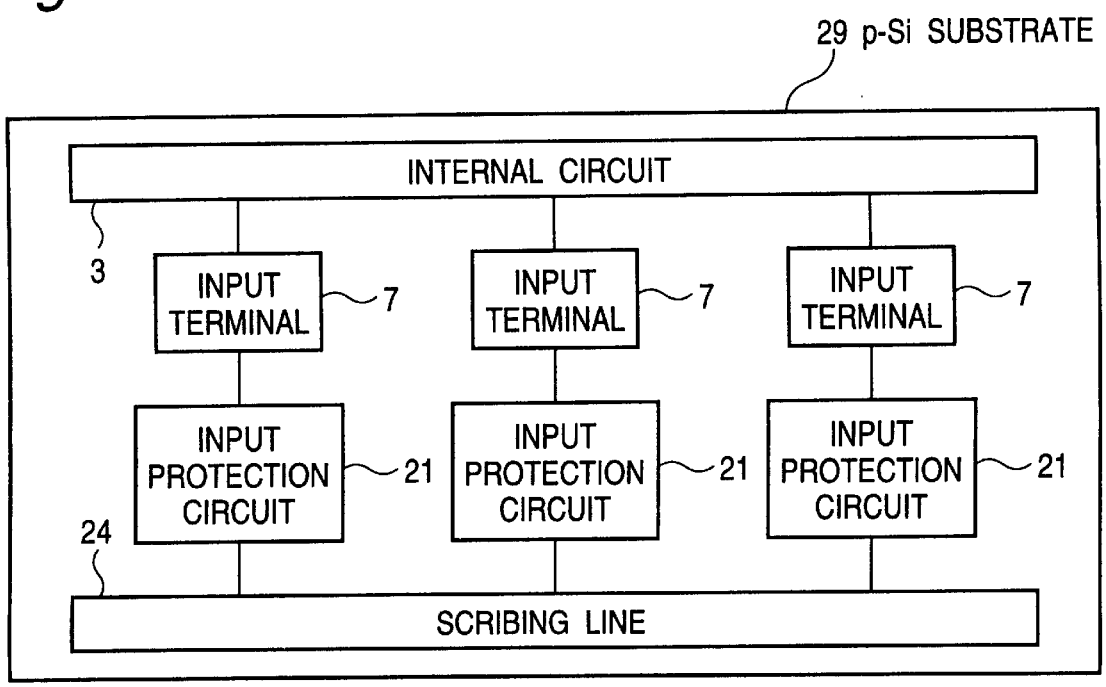
FIG. 3B is a layout diagram illustrating how the third prior art input protection circuit is located on a semiconductor chip.
Figure 4:
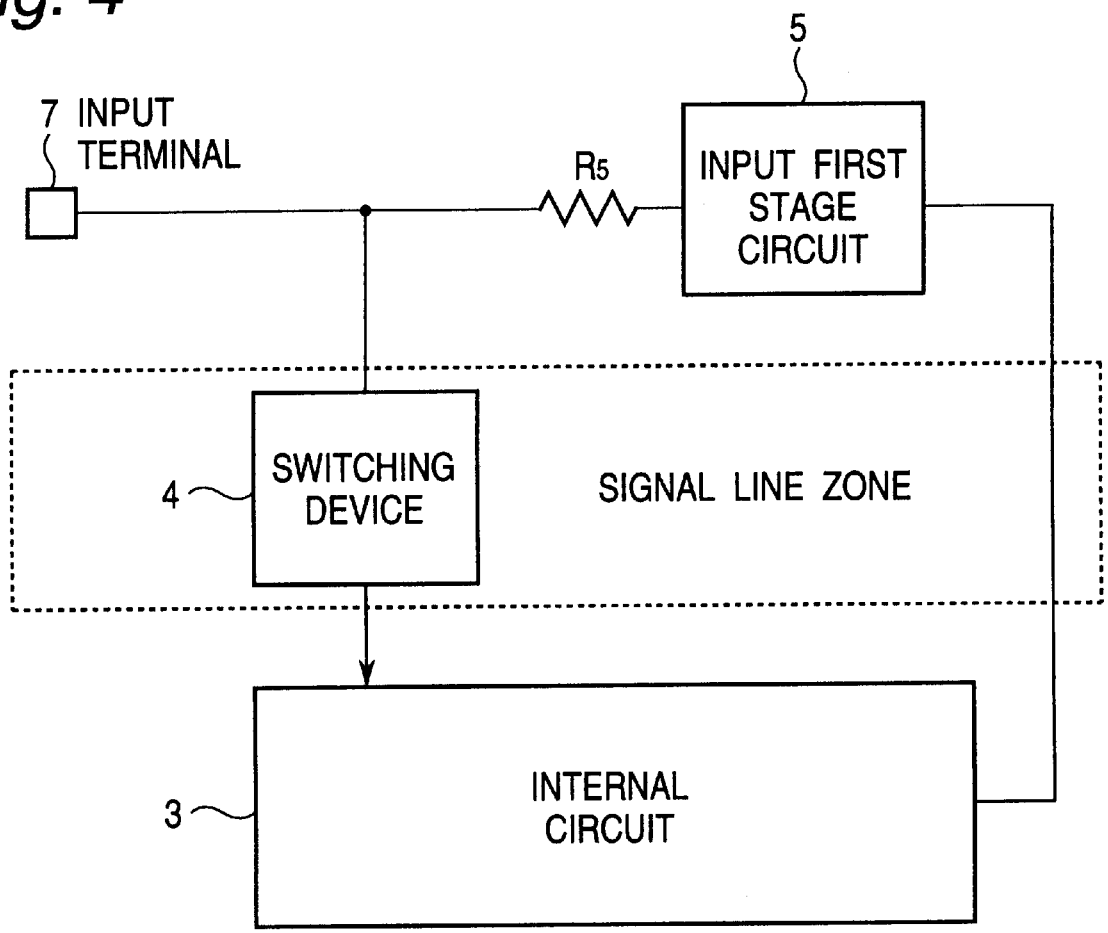
FIG. 4 is a block diagram illustrating a basic construction of the semiconductor integrated circuit including the input protection circuit in accordance with the present invention.

Referring to FIG. 4, there is shown a block diagram illustrating a basic construction of the semiconductor integrated circuit including the input protection circuit in accordance with the present invention.

As shown in FIG. 4, the semiconductor integrated circuit includes, in addition to a signal path extending from an input terminal 7 to an input first stage circuit 5, a current path branching from the midway of the signal path to pass through a switch device 4 and to reach an internal circuit 3. The switch device 4 is so configured that when the peak value of a surge voltage applied to the input terminal 7 is not less than a predetermined constant value, the switch device 4 is brought into a conducting condition, so as to create the current path leading to the internal circuit 4. As a result, the electric charge of the surge voltage applied to the input terminal 7, is discharged to line, usually a power supply voltage line or a ground line within the zone of the internal circuit. As a result, the gate oxide film of MOS transistors in the input first stage circuit is prevented from being destroyed.

With the above mentioned arrangement, the power supply voltage line or the ground line in internal circuit, which is a discharge destination of the electric charge of the surge voltage, is provided from the beginning for an inherent signal processing, and therefore, is not one which is newly provided for the input protection, with the result that there is no new increase either in a parasitic resistance or in a floating capacitance. In the following, two embodiments will be described in detail.

EMBODIMENT 1

Figure 5A:
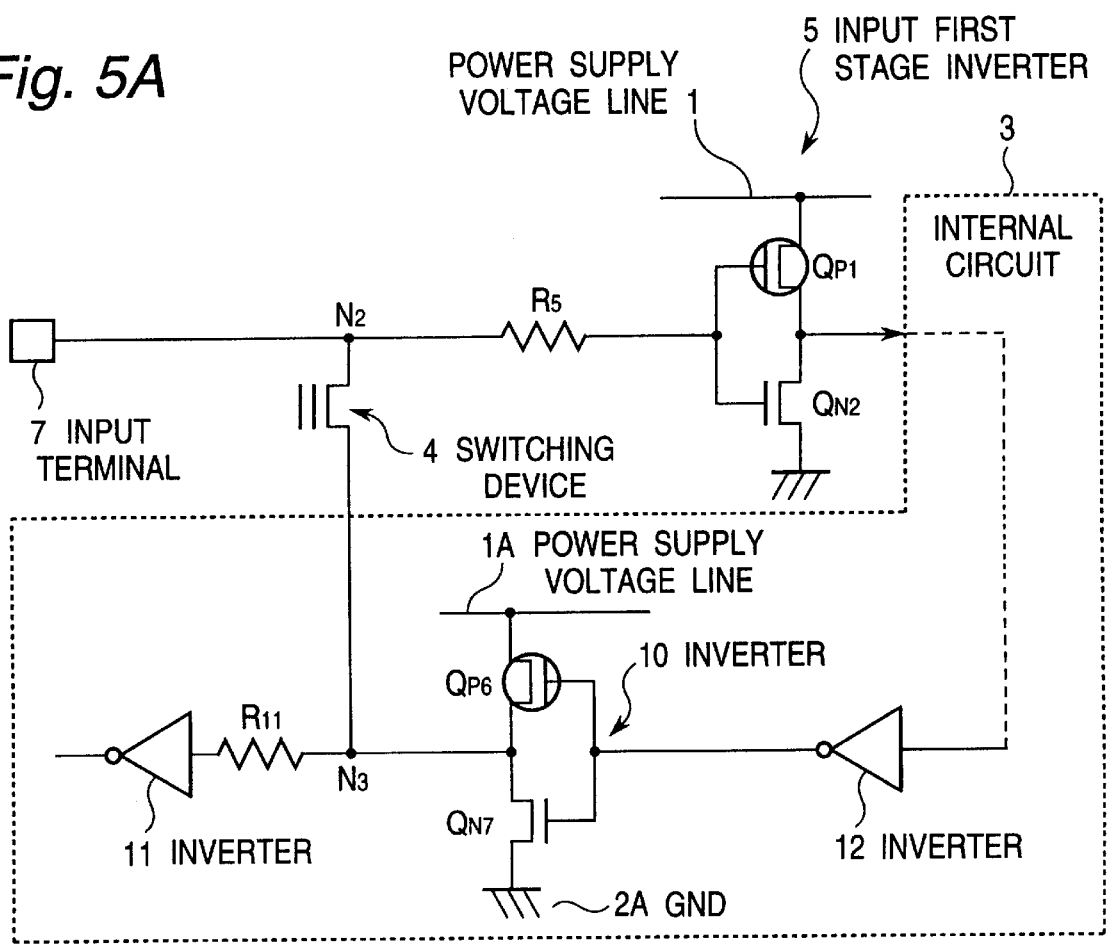
FIG. 5A is a circuit diagram of a first embodiment of the semiconductor integrated circuit including the input protection circuit in accordance with the present invention.

Referring to FIG. 5A, there is shown a circuit diagram of a first embodiment of the semiconductor integrated circuit including the input protection circuit in accordance with the present invention.

The shown semiconductor integrated circuit includes the input first stage inverter 5, the internal circuit 3 receiving an output of the input first stage inverter 5, the resistor R5 connected between the input terminal 7 and the input of the input first stage inverter 5 and the switch device 4 connected between the internal circuit 3 and a node N2 between the input terminal 7 and the resistor R5.

The input first stage inverter 5 is a CMOS inverter formed of a pMOS transistor QP1 and an nMOS transistor QN2 which are connected in series between the power supply voltage line 1 and the ground line 2 and which have respective gates connected in common to constitute an input node of the inverter. The resistor R5 is connected between the input terminal 7 and the input node of the inverter 5 (namely, the common-connected gates of the two MOS transistors). The resistor R5 is formed of polysilicon, and is formed at the same time as formation of the gate electrodes of the MOS transistors of the input first stage inverter 5 and the gate electrodes of MOS transistors included in the internal circuit 3.

The internal circuit 3 ordinarily includes a number of logic gates (not shown), but for simplification of drawing, as examples of those logic gates, only three cascaded CMOS inverters (inverters 10, 11 and 12) are depicted in FIG. 5A. The signal supplied to the first stage inverter 5 through the input terminal 7 and the resistor R5 from an external device, is inverted by the inverter 5, and then, supplied to the internal circuit 3. Thereafter, the signal is subjected to a signal processing by various logic gates included in the internal circuit 3, and then, supplied to an input node of the inverter 12. Furthermore, the signal is transmitted through the inverters 10 and 11 to other logic gates.

The switch device 4 is connected between the node N2 in the midway of the wiring conductor extending from the input terminal 7 to the resistor R5 and an output node of the inverter 10 provided in the internal circuit (a connection node N3 between a pMOS transistor QP6 and an nMOS transistor QN7, which are series-connected between the power supply voltage line 1A and the ground line 2A, to constitute the CMOS inverter, similarly to the first stage inverter 5).

Figure 5B:
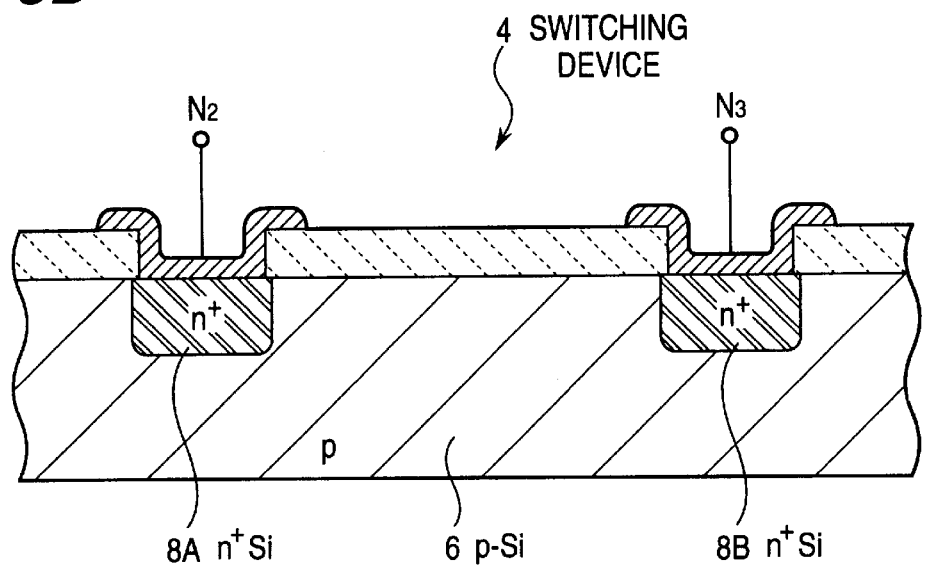
FIG. 5B is a diagrammatic sectional view of the switch device incorporated in the input protection circuit shown in FIG. 5A.

Referring to FIG. 5B which is a diagrammatic sectional view of the switch device 4 provided in the input protection circuit shown in FIG. 5A, the switch device 4 includes two n$^+$ silicon layers 8A and 8B formed separately from but close to each other in a p-type silicon region 6. For example, the n$^+$ silicon layer 8A is connected to the node N2 at the input terminal side, and the n$^+$ silicon layer 8B is connected to the node N3 in the internal circuit. This switch device 4 operates as follows: When a voltage is applied between opposite ends 8A and 8B of the switch device 4, in a PN junction biased in a reverse direction a depletion layer extends from the n$^+$ silicon layer into the p-type silicon region 6, and if the voltage applied between the opposite ends 8A and 8B is high, a punch-through or a breakdown occurs between the n$^+$ silicon layers 8A and 8B, so that the n$^+$ silicon layers 8A and 8B are short-circuited. Which of the punch-through and the breakdown occurs, is determined by the impurity concentration of the n$^+$ silicon layers 8A and 8B, the impurity concentration of the p-type silicon region 6, and the distance between the n$^+$ silicon layers 8A and 8B, and others.

Now, assume that a surge voltage is applied to the input terminal 7. As a result, the switch device 4 is brought into a short-circuited condition, so that a current path is created to extend from the input terminal 7 to the output node N3 of the inverter 10 within the internal circuit. Here, if the surge voltage is a positive voltage higher than the power supply voltage, the positive electric charges on the input terminal 7 are discharged through the pMOS transistor QP6 of the inverter 10 to a power supply voltage line 1A laid within the internal circuit for supplying the power supply voltage to the pMOS transistor QP6. On the other hand, if the surge voltage is a negative voltage lower than the ground potential, the negative electric charges on the input terminal 7 are discharged through the nMOS transistor QN7 of the inverter 10 to a ground line 2A laid within the internal circuit for supplying the ground potential to the nMOS transistor QN7. Namely, with the only one switch device 4, the discharging path is spontaneously determined by the polarity of the surge voltage. In addition, since the power supply voltage line 1A and the ground line 2A, which are a discharging destination, are laid from the beginning within the internal circuit for the inherent signal processing, the increase of the occupying area newly required for the input protection is remarkably smaller than the prior art.

In this embodiment, when the surge voltage is applied to the input terminal 7, the discharging path is determined by the two MOS transistors QP6 and QN7 which constitute the inverter 10 in the internal circuit. In a normal condition, the two MOS transistors QP6 and QN7 are isolated from the wiring conductor extending from the input terminal 7 to the input first stage inverter 5, by the switching device 4. Accordingly, the magnitude of the capacitance involving the input terminal 7 (input terminal capacitance) is independent of the MOS transistors QP6 and QN7. The input terminal capacitance becomes a total of "a junction capacitance of the N2 side of the switch device 4", "a wiring capacitance from the switch device 4 to the output node of the inverter 10 in the internal circuit" and "a gate capacitance of the input first stage inverter 5", but as mentioned above, the inverter 10 in the internal circuit is ordinarily isolated from the input terminal 7.

Incidentally, in this embodiment, the resistor R5 inserted between the input terminal 7 and the first stage inverter 5 dulls or damps an abrupt waveform of the surge voltage, similarly to the prior art input protection circuits, thereby to further elevate the protection effect. Furthermore, a resistor R11 connected between the output node of the inverter 10 within the internal circuit (namely, the connection node N3 of the switch device 4) and an input node of the next stage inverter 11 within the internal circuit, also dulls or damps an abrupt waveform of the surge voltage discharged to the node N3 when the switch device 4 is brought into the short-circuited condition, thereby to prevent the inverter 11 from being destroyed.

EMBODIMENT 2

Figure 6A:
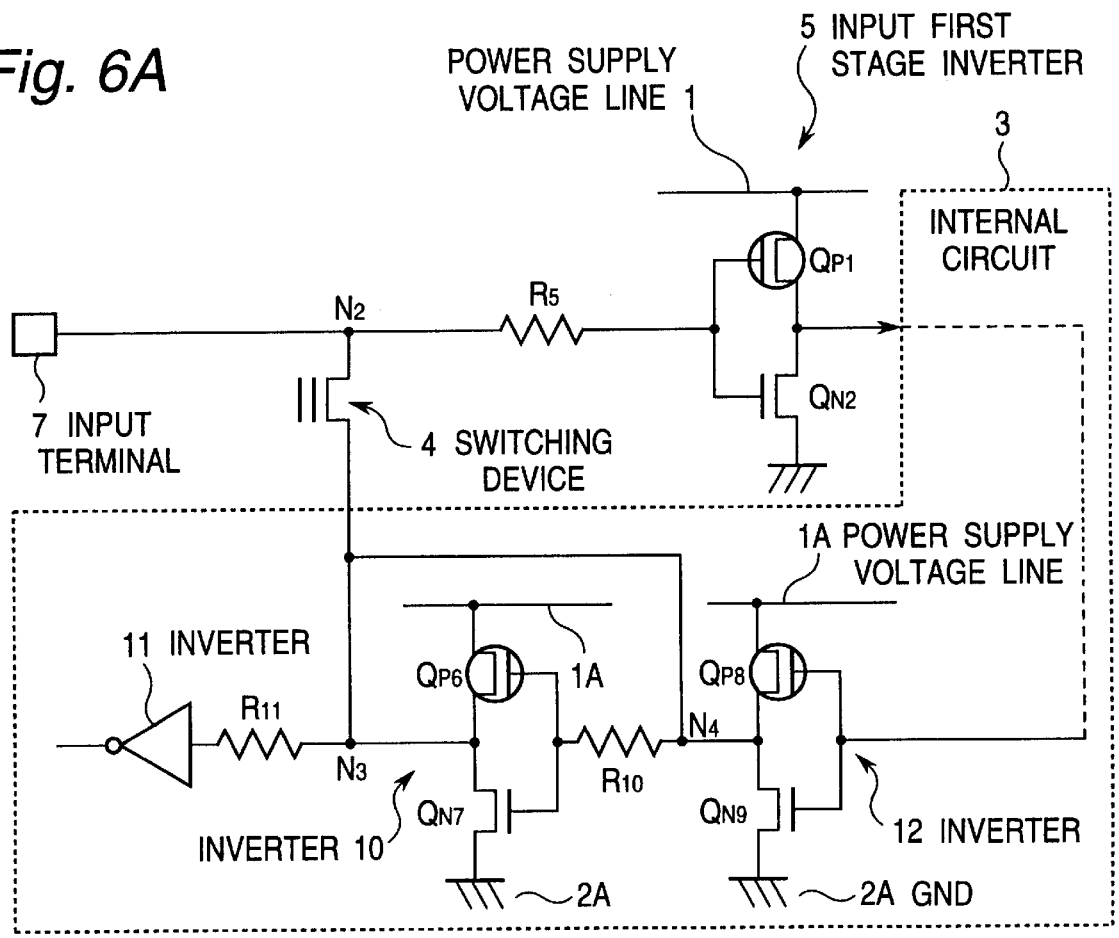
FIG. 6A is a circuit diagram of a second embodiment of the semiconductor integrated circuit including the input protection circuit in accordance with the present invention.

Now, a second embodiment of the semiconductor integrated circuit including the input protection circuit in accordance with the present invention will be described with reference to FIG. 6A, which is a circuit diagram of the second embodiment. In FIG. 6A, elements similar to those shown in FIG. 5A are given the same Reference Numerals and Signs, and explanation thereof will be omitted.

As seen from comparison between FIGS. 5A and 6A, the second embodiment is different from the first embodiment in that the discharging path extending from the switch device 4 to reach the power supply voltage line 1A and the ground line 2A within the internal circuit, branches into two in the way. Namely, the internal circuit side end of the switch device 4 is connected not only to the output node of the inverter 10 (connection node N3) but also to an output node of a preceding stage inverter 12 (connection node N4). This inverter 12 is constituted of a pMOS transistor QP8 and an nMOS transistor QN9 series-connected between the power supply voltage line 1A and the ground line 2A, similarly to the inverter 10.

Accordingly, when the surge voltage is applied to the input terminal 7, the electric charges of the surge voltage are divided into two, namely, the electric charges discharged from the input terminal 7 through the switch device 4 and the pMOS transistor QP6 (or the nMOS transistor QN7) to the power supply voltage line 1A (or the ground line 2A) within the internal circuit, and the electric charges discharged from the input terminal 7 through the switch device 4 and the pMOS transistor QP8 (or the nMOS transistor QN9) to the power supply voltage line 1A (or the ground line 2A) within the internal circuit.

In this embodiment, the discharging path after the switch device 4 is divided into a plurality of paths so that a plurality of transistors within the internal circuit are used as the discharging paths. Therefore, the input protection effect and the electrostatic breakdown voltage can be elevated without increasing the size of the transistors. In this case, there is no increase in the input terminal capacitance, because the input terminal capacitance is independent of the size and the number of the transistors which are included in the internal circuit and which are used as the discharging path for the surge voltage.

Figure 6B:
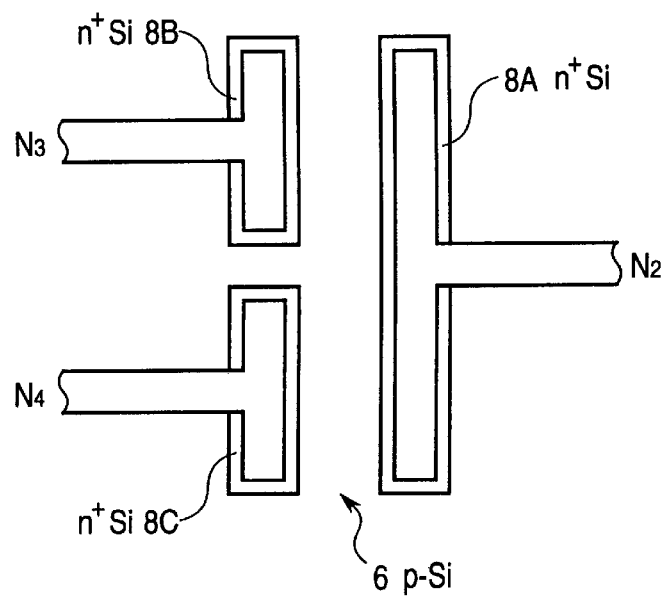
FIG. 6B is a layout pattern diagram of the switch device incorporated in the input protection circuit shown in FIG. 6A.

Now, the switch device 4 provided in this second embodiment will be described. The switch device 4 provided in the second embodiment can have a sectional structure similar to that of the switch device in the first embodiment, but is required to be modified in a plan pattern. FIG. 6B is a layout pattern diagram of the switch device 4 provided in the second embodiment.

As shown in FIG. 6B, three $n^+$ silicon layers 8A, 8B and 8C are formed in a p-type silicon region. Of these three $n^+$ silicon layers 8A, 8B and 8C, the $n^+$ silicon layer 8A is longest and is connected to the node N2. The other $n^+$ silicon layers 8B and 8C are short and are connected to the nodes N3 and N4, respectively, and are formed to oppose to the $n^+$ silicon layer 8A, as shown in FIG. 6B. By forming the switch device 4 as shown in FIG. 6B, the input and the output of the inverter 10 within the internal circuit are isolated from each other in a normal condition, and when the surge voltage is applied, the plurality of discharging paths can be created.

Next, a modification of the second embodiment will be described. In the embodiment shown in FIG. 6A, the resistors R5, R10 and R11 for damping the surge voltage waveform have been formed as an independent "circuit element" formed by ensuring a necessary region on a semiconductor chip. In this modification, these resistors are replaced by a parasitic resistance accompanying the wiring conductor (interconnection).

Figure 7:
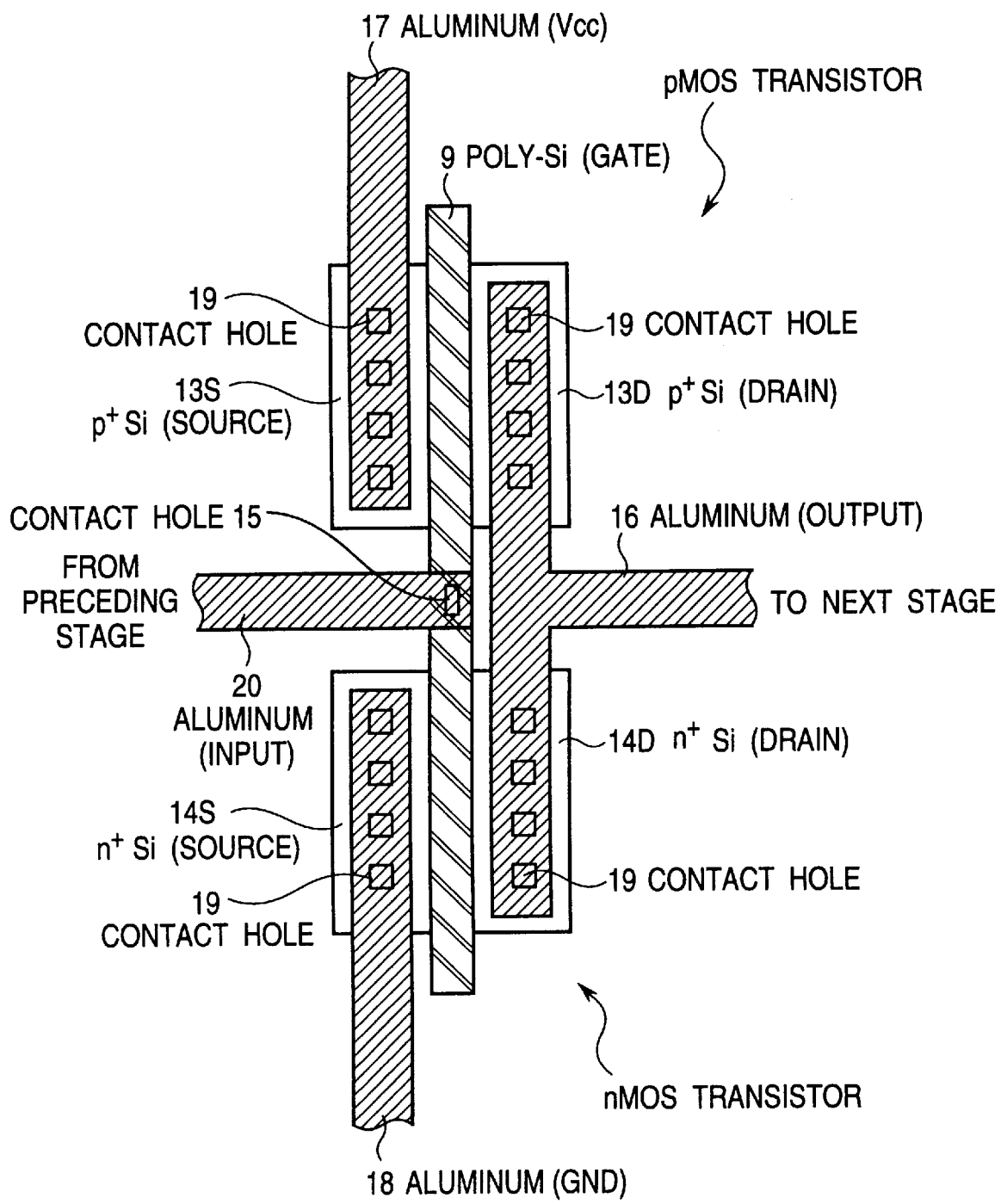
FIG. 7 is a layout pattern diagram of an inverter used in a modification of the input protection circuit shown in FIG. 6A.

Referring to FIG. 7, there is shown a layout pattern diagram of the inverter 5, 10 or 11 in the input protection circuit shown in FIG. 6A. In FIG. 7, single-line hatching regions indicate an aluminum wiring conductor, and double-line hatching regions denote a polysilicon wiring conductor.

In an upper half of the drawing, a pair of p+ silicon regions 13D and 13S are formed separated from each other but to oppose to each other, and a polysilicon wiring conductor 9 extends between the p+ silicon regions 13D and 13S, vertically in the drawing. The p+ silicon regions and the polysilicon wiring conductor constitute a pMOS transistor. The p+ silicon regions 13D and 13S form a drain region and a source region of the pMOS transistor, respectively, and the polysilicon wiring conductor 9 forms a gate electrode of the pMOS transistor.

In a lower half of the drawing, a pair of $n^+$ silicon regions 14D and 14S are formed separated from each other but to oppose to each other, and the polysilicon wiring conductor 9 in common to the gate electrode of the pMOS transistor, extends between the $n^+$ silicon regions 14D and 14S, vertically in the drawing. The $n^+$ silicon regions and the polysilicon wiring conductor constitute an nMOS transistor. The $n^+$ silicon regions 14D and 14S form a drain region and a source region of the nMOS transistor, respectively, and the polysilicon wiring conductor 9 forms a gate electrode of the nMOS transistor.

In the pMOS transistor, an aluminum wiring conductor 17 is laid to extend on the source region 13S, and is connected to the source region 13S by a plurality of contact holes 19. The aluminum wiring conductor 17 is connected to the power supply voltage line (not shown) laid within the internal circuit. On the other hand, an aluminum wiring conductor 16 is laid to extend on the drain region 13D, and is connected to the drain region 13D by a plurality of contact holes 19. The aluminum wiring conductor 16 is connected to an input node of a next stage logic gate (not shown) which should be located at a right side of the drawing. In the nMOS transistor, an aluminum wiring conductor 18 is laid to extend on the source region 14S, and is connected to the source region 14S by a plurality of contact holes 19. The aluminum wiring conductor 18 is connected to the ground line (not shown) laid within the internal circuit. On the other hand, the aluminum wiring conductor 16 in common to the pMOS transistor, is laid to extend on the drain region 14D, and is connected to the drain region 14D by a plurality of contact holes 19.

Also, an aluminum wiring conductor 20 is laid to extend to the polysilicon wiring conductor (gate electrode) 9 in common to the pMOS transistor and the nMOS transistor, from an output node of a preceding stage inverter (not shown, or the input terminal, also not shown) which should be located at a left side of the drawing. The aluminum wiring conductor 20 is connected to the polysilicon wiring conductor 9 through a contact hole 15.

The inverter shown in FIG. 7 is an example in which the resistance given to the input node of the inverter is formed by the polysilicon gate electrode 9 connected to the aluminum input wiring conductor 20. The polysilicon gate electrode and wiring conductor 9 has the resistance value per a unit area (1 $\mu m^2$) of about 14 $\Omega$(sheet resistance), which is sufficiently larger than the sheet resistance of the aluminum input wiring conductor 20 (about 0.1$\Omega$). Therefore, the resistance of the polysilicon gate electrode and wiring conductor 9 becomes dominant.

In the above mentioned embodiments 1 and 2, the resistors R5, R10 and R11 are formed of the polysilicon layer, but the present invention is in no way limited to this material of the resistors. In semiconductor integrated circuits, other materials, for example, a metal thin film or a crystalline silicon layer doped with impurity by a thermal diffusion or an ion implantation, has been used as the resistor material. A resistor formed of any one of these materials can be used in the present invention.

As seen from the above, the semiconductor integrated circuit having the input protection circuit in accordance with the present invention has the following advantages:

A first advantage is that it is possible to reduce the area required for the input protection when the surge voltage is applied. In the prior art, in order to discharge the electric charge of the surge voltage to either the power supply voltage line or the ground line, there were required at least two circuit elements which are alternatively brought into a conducting condition when the surge voltage is applied. In the present invention, on the other hand, the circuit element newly required for the input protection is only the switch device which causes the breakdown or the punch-through because of the surge voltage, since the transistors constituting the logic gate provided in the internal circuit are used as the discharging path, and since the power supply voltage line and the ground line laid from the beginning within the internal circuit for the inherent signal processing of the semiconductor integrated circuit are used as the discharge destination.

A second advantage is that it is possible to elevate the input protection capacity without increasing the input terminal capacitance. In the present invention, one which determines the actual input protection capacity is the transistors constituting the logic gate provided in the internal circuit. In a normal operation, however, the transistors constituting the logic gate provided in the internal circuit are isolated from the input terminal by the switching device. Therefore, even if the size and the number of the transistors, which constitute the logic gate or gates provided in the internal circuit and which become the discharging path when the surge voltage is applied, are increased, there is no increase in the input terminal capacitance.

A third advantage is that the degree of freedom in designing the circuit layout can be elevated. In the present invention, the discharging path created when the surge voltage is applied, is formed of the MOS transistors which constitute the logic gate or gates provided in the internal circuit. The discharge destination is the power supply voltage line and the ground line laid from the beginning within the internal circuit. It is a matter of course that the transistors and the power supply voltage line and the ground line are located close to each other in the internal circuit. Accordingly, differently from the prior art using the common discharging line, it is no longer necessary to locate the circuit elements of the input protection circuit near to the common discharging line such as the scribing line. In this regard, therefore, there is no restriction to the circuit layout.

The invention has thus been shown and described with reference to the specific embodiments. However, it should be noted that the present invention is in no way limited to the details of the illustrated structures but changes and modifications may be made within the scope of the appended claims.

We claim:

1. A semiconductor integrated circuit including an external terminal, an input first stage circuit connected to receive a signal supplied through said external terminal, an internal circuit receiving an output signal outputted from said input first stage circuit, for executing an inherent signal processing of the semiconductor integrated circuit for the received output signal, and an input protection circuit connected between said external terminal, and an output node of a logic gate included in said internal circuit for discharging an electric charge applied to said external terminal to a line when an overvoltage sufficient to break said input first stage circuit is applied to said external terminal, said input protection circuit being configured to discharge said electric charge applied to said external terminal, to said line which is laid within said internal circuit for supplying a potential into said internal circuit.

2. A semiconductor integrated circuit according to claim 1, wherein said line is a power supply voltage line and said potential is a power supply voltage.

3. A semiconductor integrated circuit according to claim 1, wherein said line is a ground potential line and potential is a ground potential.

4. A semiconductor integrated circuit including an external terminal, an input first stage circuit connected to receive a signal supplied through said external terminal, an internal circuit receiving an output signal outputted from said input first stage circuit, for executing an inherent signal processing of the semiconductor integrated circuit for the received output signal, and an input protection circuit connected between said external terminal, and an output node of a logic gate included in said internal circuit for discharging an electric charge applied to said external terminal to a line when an overvoltage sufficient to break said input first stage circuit is applied to said external terminal, said input protection circuit being configured to discharge said electric charge applied to said external terminal, through a MOS field effect transistor constituting a logic gate included in said internal circuit, to said line which is laid within said internal circuit for supplying a potential to said MOS field effect transistor.

5. A semiconductor integrated circuit according to claim 4, wherein said line is a power voltage supply line and said potential is a power supply voltage.

6. A semiconductor integrated circuit according to claim 4, wherein said line is a ground potential line and said potential is a ground potential.

7. A semiconductor integrated circuit including an external terminal, an input first stage circuit connected to receive a signal supplied through said external terminal, an internal circuit receiving an output signal outputted from said input first stage circuit, for executing an inherent signal processing of the semiconductor integrated circuit for the received output signal, and an input protection circuit connected between said external terminal, and an output node of a logic gate included in said internal circuit for discharging an electric charge applied to said external terminal to a line when an overvoltage sufficient to break said input first stage circuit is applied to said external terminal, said input protection circuit including a normally-off switch device configured to become a conducting condition in accordance with a voltage applied between opposite ends of said switch device, one of said opposite ends of said switch device being connected to a wiring conductor connecting said external terminal to an input node of said input first stage circuit, and the other of said opposite ends of said switch device being connected to said output node of said logic gate included in said internal circuit, whereby, when an overvoltage not less than a voltage bringing said switch device into said conducting condition is applied to said external terminal, a discharging path is created to extend from said external terminal, through a MOS field effect transistor constituting said logic gate included in said internal circuit, to said line which is laid within said internal circuit for supplying a potential to said MOS field effect transistor.

8. A semiconductor integrated circuit claimed in claim 7 wherein a first resistance is inserted in said wiring conductor extending from said external terminal to said input node of said input first stage circuit, between a connection node of said wiring conductor connected to said switch device and said input node of said input first stage circuit.

9. A semiconductor integrated circuit claimed in claim 8 wherein a second resistance is inserted between a wiring conductor connecting between said switch device and said output node of said logic gate within said internal circuit, and an input node of a second logic gate which is included in said internal circuit and which receives an output signal of the first named logic gate.

10. A semiconductor integrated circuit claimed in claim 9 wherein at least one of said first resistance and said second resistance is constituted of a resistor element formed of one selected from the group consisting of a polysilicon film, a metal thin film and an impurity-doped crystalline silicon layer.

11. A semiconductor integrated circuit claimed in claim 10 wherein said switch device is constituted of a breakdown device which has two opposite regions of a first conductivity type formed, separated from each other, in a region of a second conductivity type opposite to said first conductivity type, and which becomes a conducting condition by a breakdown caused in response to an overvoltage applied between said opposite regions.

12. A semiconductor integrated circuit claimed in claim 10 wherein said switch device is constituted of a punch-through device which two opposite regions of a first conductivity type formed, separated from each other, in a region of a second conductivity type opposite to said first conductivity type, and which becomes a conducting condition by a punch-through caused in response to an overvoltage applied between said opposite regions.

13. A semiconductor integrated circuit claimed in claim 9 wherein at least one of said first resistance and said second resistance is given by a parasitic resistance of a wiring conductor formed of one selected from the group consisting of a polysilicon film, a metal thin film and an impurity-doped crystalline silicon layer.

14. A semiconductor integrated circuit claimed in claim 13 wherein said switch device is constituted of a breakdown device which has two opposite regions of a first conductivity type formed, separated from each other, in a region of a second conductivity type opposite to said first conductivity type, and which becomes a conducting condition by a breakdown caused in response to an overvoltage applied between said opposite regions.

15. A semiconductor integrated circuit claimed in claim 13 wherein said switch device is constituted of a punch-through device which two opposite regions of a first conductivity type formed, separated from each other, in a region of a second conductivity type opposite to said first conductivity type, and which becomes a conducting condition by a punch-through caused in response to an overvoltage applied between said opposite regions.

16. A semiconductor integrated circuit claimed in claim 7 wherein said switch device is constituted of a breakdown device which has two opposite regions of a first conductivity type formed, separated from each other, in a region of a second conductivity type opposite to said first conductivity type, and which becomes a conducting condition by a breakdown caused in response to an overvoltage applied between said opposite regions.

17. A semiconductor integrated circuit claimed in claim 16 wherein a first resistance is inserted in said wiring conductor extending from said external terminal to said input node of said input first stage circuit, between a connection node of said wiring conductor connected to said switch device and said input node of said input first stage circuit.

18. A semiconductor integrated circuit claimed in claim 17 wherein a second resistance is inserted between a wiring conductor connecting between said switch device and said output node of said logic gate within said internal circuit, and an input node of a second logic gate which is included in said internal circuit and which receives an output signal of the first named logic gate.

19. A semiconductor integrated circuit claimed in claim 18 wherein at least one of said first resistance and said second resistance is constituted of a resistor element formed of one selected from the group consisting of a polysilicon film, a metal thin film and an impurity-doped crystalline silicon layer.

20. A semiconductor integrated circuit claimed in claim 18 wherein at least one of said first resistance and said second resistance is given by a parasitic resistance of a wiring conductor formed of one selected from the group consisting of a polysilicon film, a metal thin film and an impurity-doped crystalline silicon layer.

21. A semiconductor integrated circuit claimed in claim 7 wherein said switch device is constituted of a punch-through device which two opposite regions of a first conductivity type formed, separated from each other, in a region of a second conductivity type opposite to said first conductivity type, and which becomes a conducting condition by a punch-through caused in response to an overvoltage applied between said opposite regions.

22. A semiconductor integrated circuit claimed in claim 21 wherein a first resistance is inserted in said wiring conductor extending from said external terminal to said input node of said input first stage circuit, between a connection node of said wiring conductor connected to said switch device and said input node of said input first stage circuit.

23. A semiconductor integrated circuit claimed in claim 22 wherein a second resistance is inserted between a wiring conductor connecting between said switch device and said output node of said logic gate within said internal circuit, and an input node of a second logic gate which is included in said internal circuit and which receives an output signal of the first named logic gate.

24. A semiconductor integrated circuit according to claim 7, wherein said line is a power supply voltage line and said potential is a power supply voltage potential.

25. A semiconductor integrated circuit according to claim 7, wherein said line is a ground potential line and said potential is a ground potential.

* * * * *